United States Patent
Chun et al.

(10) Patent No.: US 9,165,854 B2
(45) Date of Patent: Oct. 20, 2015

(54) HEAT DISSIPATION FEATURES, ELECTRONIC DEVICES INCORPORATING HEAT DISSIPATION FEATURES, AND METHODS OF MAKING HEAT DISSIPATION FEATURES

(75) Inventors: Dexter T. Chun, San Diego, CA (US); Victor A. Chiriac, San Diego, CA (US); James H. Thompson, San Diego, CA (US); Stephen A. Molloy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 637 days.

(21) Appl. No.: 13/445,385

(22) Filed: Apr. 12, 2012

(65) Prior Publication Data
US 2013/0271920 A1 Oct. 17, 2013

(51) Int. Cl.
*H05K 7/20* (2006.01)
*H01L 23/373* (2006.01)
*H01L 23/367* (2006.01)

(52) U.S. Cl.
CPC .......... *H01L 23/3672* (2013.01); *H05K 7/2039* (2013.01); *H05K 7/20409* (2013.01); *H01L 2924/0002* (2013.01); *Y10T 29/49826* (2015.01)

(58) Field of Classification Search
USPC .................. 361/704, 707, 709–710; 165/185; 174/547–548
See application file for complete search history.

(56) References Cited

U.S. PATENT DOCUMENTS 3,789,654 A * 2/1974 Jones ............................... 374/43
5,086,509 A * 2/1992 Inubushi et al. ........... 455/575.8

(Continued)

FOREIGN PATENT DOCUMENTS

EP 0878989 A2 11/1998
JP H1197871 A 4/1999

(Continued)

OTHER PUBLICATIONS

"Specific Heat of some Common Substrances", downloaded from http://www.engineeringtoolbox.com/specific-heat-capacity-d_391.html on Apr. 30, 2015, 8 pages.*

(Continued)

*Primary Examiner* — Robert J Hoffberg
(74) *Attorney, Agent, or Firm* — Michelle S. Gallardo (57) ABSTRACT

Electronic devices incorporating a heat dissipation feature include an enclosure, and at least one heat-generating component positioned within the enclosure. The heat dissipation feature is sufficiently coupled to the at least one heat-generating component to facilitate conductive heat transfer from the heat-generating component. The heat dissipation feature includes a plurality of protrusions exposed externally to the enclosure. A thermally insulating material may be disposed on at least a tip portion of at least some of the protrusions. The thermally insulating material is selected to provide a touch temperature that is below a predetermined threshold. In some instances, the thermally insulating material can provide such a touch temperature by selecting the material to include properties for thermal conductivity (k), density ($\rho$), and specific heat ($C_p$) such that the product of $k*\rho*C_p$ results in a value less than a product of $k*\rho*C_p$ for human skin.

33 Claims, 6 Drawing Sheets

(56) References Cited

U.S. PATENT DOCUMENTS

| | | | |
|---|---|---|---|
| 6,097,597 A * | 8/2000 | Kobayashi | 361/679.47 |
| 6,303,209 B1 * | 10/2001 | Kobayashi | 428/141 |
| 6,355,332 B1 * | 3/2002 | Kobayashi | 428/143 |
| 6,358,595 B1 * | 3/2002 | Kobayashi | 428/143 |
| 6,529,374 B2 * | 3/2003 | Yamashita et al. | 361/679.33 |
| 6,687,123 B2 * | 2/2004 | Kitahara | 361/695 |
| 7,188,484 B2 | 3/2007 | Kim | |
| 7,450,390 B2 * | 11/2008 | Lanni | 361/719 |
| 7,481,576 B2 * | 1/2009 | Ahmad et al. | 374/109 |
| 7,578,615 B2 * | 8/2009 | Ahmad et al. | 374/109 |
| 7,592,695 B2 | 9/2009 | Reis et al. | |
| 7,733,647 B2 * | 6/2010 | Lee | 361/690 |
| 7,839,630 B2 | 11/2010 | Hwang et al. | |
| 7,903,409 B2 | 3/2011 | Patel et al. | |
| 7,957,131 B1 | 6/2011 | Mongia et al. | |
| 8,054,629 B2 | 11/2011 | Li et al. | |
| 8,482,922 B2 * | 7/2013 | Li et al. | 361/703 |
| 2005/0259385 A1 | 11/2005 | Solomon et al. | |
| 2006/0240260 A1 | 10/2006 | Heino et al. | |
| 2008/0310108 A1 | 12/2008 | Eriksson et al. | |
| 2009/0147481 A1 | 6/2009 | Shimoura | |
| 2010/0079955 A1 * | 4/2010 | Li et al. | 361/703 |
| 2011/0069451 A1 * | 3/2011 | Hobein et al. | 361/695 |
| 2011/0073294 A1 | 3/2011 | MacDonald et al. | |
| 2011/0228486 A1 | 9/2011 | Lanni | |
| 2014/0098489 A1 * | 4/2014 | Chiriac et al. | 361/679.54 |
| 2014/0268564 A1 * | 9/2014 | Sagneri et al. | 361/692 |

FOREIGN PATENT DOCUMENTS

| | | |
|---|---|---|
| JP | 2000020171 A | 1/2000 |
| JP | 2004200586 A | 7/2004 |
| TW | 507522 B | 10/2002 |
| WO | 2004050343 A1 | 6/2004 |
| WO | 2008047254 A2 | 4/2008 |

OTHER PUBLICATIONS

"Engineering Material—Comparing some typical properties of common engineering materials like steel, plastic, ceramics and composites", downloaded from http://www.engineeringtoolbox.com/engineering-materials-properties-d_1225.html on Apr. 30, 2015, 6 pages.*

International Search Report and Written Opinion—PCT/US2013/036461—ISA/EPO—Sep. 3, 2013.

Cole, et al., "Analysis of Flux-Base Fins for Estimation of Heat Transfer Coefficient," International Journal of Heat and Mass Transfer 52:1-2, Jan. 15, 2009, pp. 92-99, published online Jul. 27, 2008, 9 pages.

RTC, Products & Technology [online], Jan. 3, 2012 Retrieved from the Internet: http://rtcmagazine.com/articles/print_article/100906, 27 pages.

* cited by examiner

HEAT DISSIPATION FEATURES, ELECTRONIC DEVICES INCORPORATING HEAT DISSIPATION FEATURES, AND METHODS OF MAKING HEAT DISSIPATION FEATURES

BACKGROUND

1. Field

Various features disclosed herein pertain generally to electronic devices, and at least some features pertain to devices and methods for facilitating heat dissipation for electronic devices.

2. Background

As handheld and portable electronic devices increase in capability and functionality, the electronics within the devices must provide improved computational performance levels. In order to achieve these higher computational performance levels, such electronic devices must dissipate increasing amounts of energy in the form of heat. Due to the compact size of typical devices, this energy can rapidly heat the device, causing discomfort or even injury to the user who is touching the device (e.g., with hands, face, body).

Human skin can be sensitive to the heat dissipated by the device surface. Conventionally, electronic thermal management systems employ multiple temperature sensors to monitor and manage the overall temperature of the device. When the temperature becomes excessive, software and/or hardware may restrict (e.g., throttle down) the overall performance of the device by reducing the computational performance of the integrated circuits. Because of the sensitivity of human skin to the heat dissipated by the device surface, the thermal management typically starts restricting the device (processor) performance once the temperature of the enclosure reaches about 45° C. This restriction can become a major limitation to performance. For example, the frame rate of graphics or video may be restricted, the speed of computation and/or responsiveness of an application may be restricted, etc.

Another conventional solution to thermal management involves fan-forced active cooling to improve heat transfer, but this option is limited in practicality and is expensive. Fan forced cooling systems can result in increased power consumption to energize the forced air, and may also increase the size of the device housing, noise, and reliability. Air cooling is also limited by the small form factor of many portable electronic devices.

SUMMARY

Various features facilitate heat dissipation in electronic devices, such as portable electronic devices. One aspect provides electronic devices including an enclosure and at least one heat-generating component positioned within the enclosure. A heat dissipation feature is thermally coupled to the one or more heat-generating components to facilitate conductive heat transfer from the heat-generating component. The heat dissipation component includes a plurality of protrusions exposed externally to the enclosure, and a thermally insulating material disposed on at least a tip portion of at least some of the plurality of protrusions. The thermally insulating material may be selected to provide a touch temperature that is below a predetermined threshold.

According to at least one further aspect, heat dissipation features are provide, which are adapted for use in electronic devices. Such heat dissipation features can include a base adapted to facilitate conductive heat transfer from a heat-generating component. A plurality of protrusions may extend from the base, where the protrusions are adapted for exposure external to an enclosure of an electronic device. A thermally insulating material may be disposed on at least a tip portion of at least some protrusions of the plurality of protrusions. The thermally insulating material may be selected to comprise respective values for properties of thermal conductivity (k), density ($\rho$), and specific heat ($C_p$) such that a product of these values ($k*\rho*C_p$) is less than a product of values for the same properties $k*\rho*C_p$ for human skin In yet further aspects, methods of making electronic devices are included. According to at least one example, such methods may include forming a base and a plurality of protrusions extending from the base. A thermally insulating material may be disposed on at least a tip portion of at least some of the protrusions. The thermally insulating material may comprise respective values for properties of thermal conductivity (k), density ($\rho$), and specific heat ($C_p$) such that a product of these values ($k*\rho*C_p$) is less than a product of values for the same properties $k*\rho*C_p$ for human skin. The base may be disposed in relation to at least one heat-generating component so as to facilitate conductive heat transfer from the heat-generating component to the base and the plurality of protrusions.

According to further aspects, electronic devices are provided, where the electronic devices include means for conductively transferring heat from a heat-generating component positioned within an enclosure to an environment external to the enclosure. Means are also included for providing a touch temperature that is below a predetermined threshold.

DETAILED DESCRIPTION

The illustrations presented herein are, in some instances, not actual views of any particular protrusions, heat dissipation features or electronic devices, but are merely idealized representations which are employed to describe various aspects relating to the present disclosure. Additionally, elements common between figures may retain the same numerical designation.

Overview

Electronic devices including a heat dissipation feature are presented, where the heat dissipation feature is adapted to facilitate the conductive transfer of heat from a heat-generating component within an enclosure of the electronic device to an environment external to the enclosure. The heat dissipation feature includes a thermally insulating material disposed on a surface of a plurality of protrusions to protect a user of the electronic device from discomfort and/or injury that may be caused by the temperature of the heat dissipation feature that is exposed to the environment external to the enclosure. The thermally insulating material is selected to provide a touch temperature that is below a predetermined threshold. In some instances, the thermally insulating material can provide such a touch temperature by selecting the material to include properties for thermal conductivity (k), density ($\rho$), and specific heat ($C_p$) such that the product of $k*\rho*C_p$ results in a value less than a product of $k*\rho*C_p$ for human skin.

Electronic Devices

Figure 1:
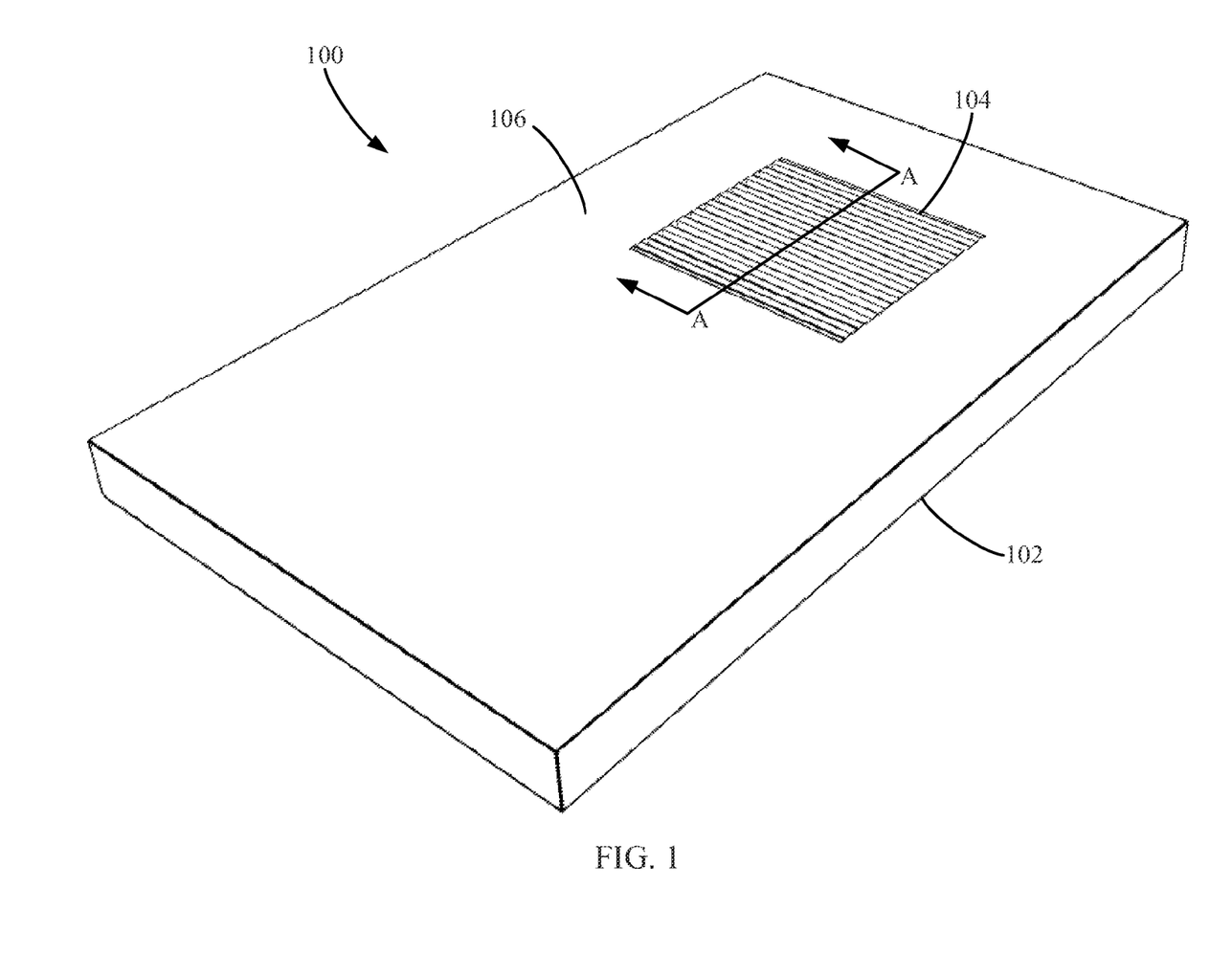
FIG. 1 illustrates an isometric view of an electronic device according to at least one example.

Various aspects of the present disclosure include electronic devices adapted to facilitate the transfer of heat from internal components to an area external to the electronic device. Referring to FIG. 1, an isometric view of an electronic device 100 is shown according to at least one example. As illustrated, the electronic device 100 includes an enclosure 102 and a heat dissipation feature 104.

Figure 8:
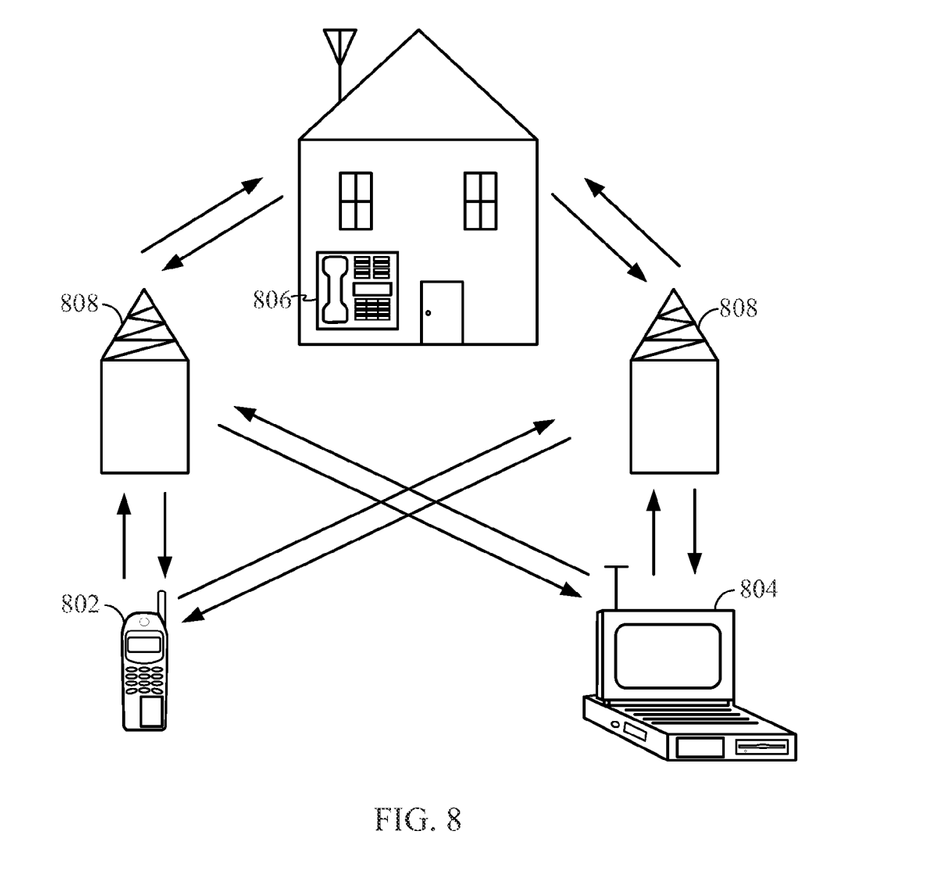
FIG. 8 is a block diagram illustrating some non-limiting examples of electronic devices.

According to at least one feature, the electronic device 100 can be adapted for portability. That is, the electronic device 100 may be a portable and/or handheld electronic device, although the electronic device may also be at least substantially stationary according to various embodiments. FIG. 8 is a block diagram illustrating some examples of electronic devices. In FIG. 8, an electronic device is shown as a mobile telephone 802, a portable computer 804, and a fixed location remote unit 806 in a wireless local loop system. As shown, the electronic devices can communicate with each other either directly or by way of one or more relay devices 808. Referring again to FIG. 1, by way of example and not limitation, the electronic device 100 may be implemented as a mobile phone, a smart phone, a session initiation protocol (SIP) phone, a laptop, a notebook, a netbook, a smartbook, an ultrabook, a tablet, an e-book reader, a personal digital assistant (PDA), a global positioning system (GPS) device, a navigation device, a multimedia device, a video device, a music player, an entertainment unit, a set-top box, a fixed location data unit such as a meter reading equipment, a camera, a game console, or any other electronic device that may come into contact with a user's skin when used. Although various examples of electronic devices are illustrated and/or described herein, the disclosure is not limited to these examples. Aspects of the present disclosure may be suitably employed in any electronic device which is adapted to come into contact with a user's skin during use. The electronic device 100 may also include other features that are not shown, such as a user interface (e.g., touch screen, display, keyboard, mouse), an input interface for connecting one or more input devices, an output interface for connecting one or more output devices, etc.

The enclosure 102 is sized and shaped to house one or more electronic components of the electronic device 100. For instance, the enclosure 102 may be configured to at least substantially enclose one or more electronic components. The enclosure 102 can be formed of any of a plurality of suitable materials, or combination of materials. For example, the enclosure 102 may be formed from a metal or metal alloy, a polymer, glass, as well as any other suitable material, or any combination of materials.

The heat dissipation feature 104, which may also be characterized as a heat dissipation component, can be disposed at one or more different sides of the enclosure 102. The heat dissipation feature 104 may be disposed to form an entire surface of the enclosure 102 (e.g., an entire surface of the back side opposite a display, an entire side surface, etc.), or the heat dissipation feature 104 may be disposed at only a portion of a surface of the enclosure 102. The specific size and shape of the heat dissipation feature 104 can vary according to the particular implementation and varying design requirements.

Generally speaking, one or more heat dissipation features 104 are exposed at an outer surface 106 of the enclosure 102. In at least some examples, at least a portion of a heat dissipation feature 104 may be exposed through an aperture (e.g., the aperture 206 in FIG. 2) formed in a portion of the enclosure 102. In one or more other examples, a heat dissipation feature 104 may be integrally formed with the enclosure and exposed at the outer surface 106 thereof.

Figure 2:
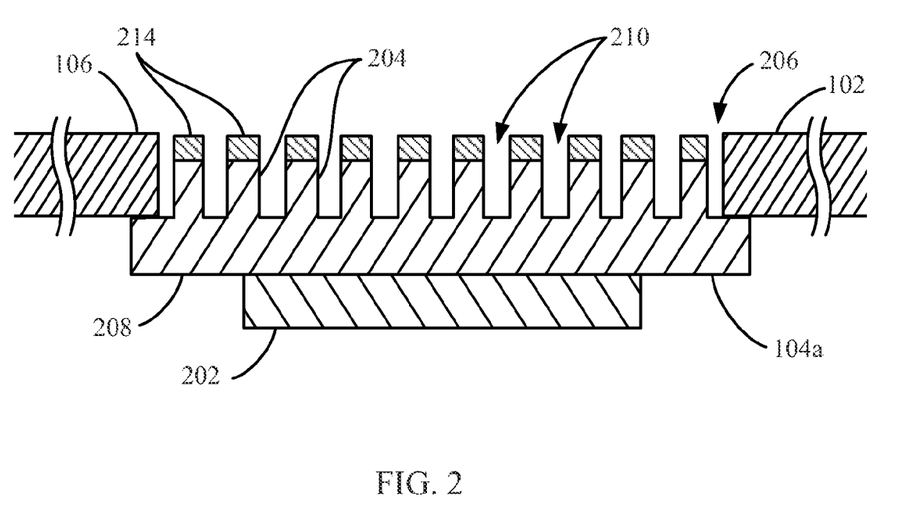
FIG. 2 illustrates a cross-sectioned elevation view taken at section A-A in FIG. 1 according to an example where a heat dissipation feature is exposed through an aperture in the enclosure.

Turning to FIG. 2, a cross-sectioned elevation view is shown taken at section A-A in FIG. 1 according to at least one example where a heat dissipation feature 104a is exposed through an aperture 206 in the enclosure 102. As illustrated, the enclosure 102 is a distinct structure from the heat dissipation feature 104a. In some examples, the heat dissipation feature 104a can be abutted to the enclosure 102 with a plurality of protrusions 204 exposed through the aperture 206. In other examples, the heat dissipation feature 104a can be positioned proximate to the enclosure 102, without necessarily touching the enclosure. In such instances, one or more additional structures may be positioned between the heat dissipation feature 104a and the enclosure 102, so long as the plurality of protrusions 204 are exposed through the aperture 206.

Figure 3:
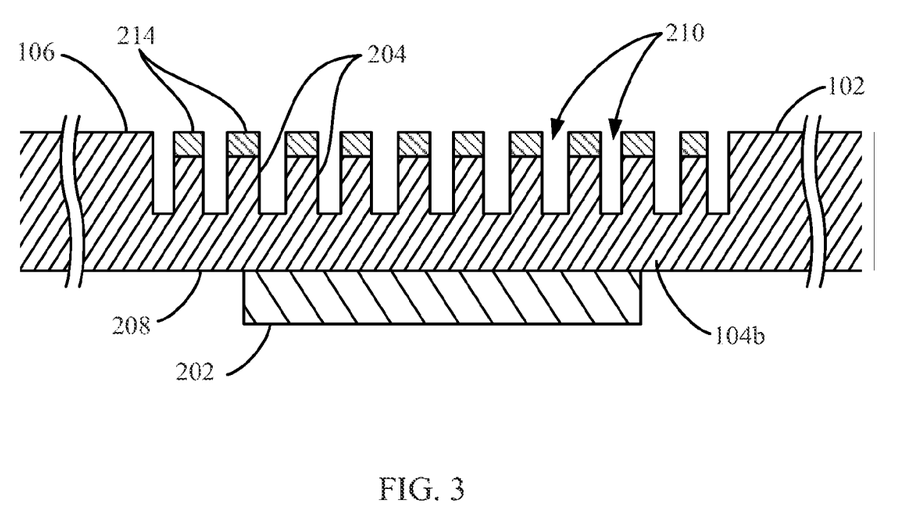
FIG. 3 illustrates a cross-sectioned elevation view taken at section A-A in FIG. 1 according to an example where a heat dissipation feature is integral to the enclosure.

Turning to FIG. 3, a cross sectioned elevation view is shown taken at section A-A in FIG. 1 according to at least one example where a heat dissipation feature 104b is integral to the enclosure 102. As illustrated, the heat dissipation feature 104b can be formed integrally with the enclosure 102 and exposed to an external environment.

Figure 7:
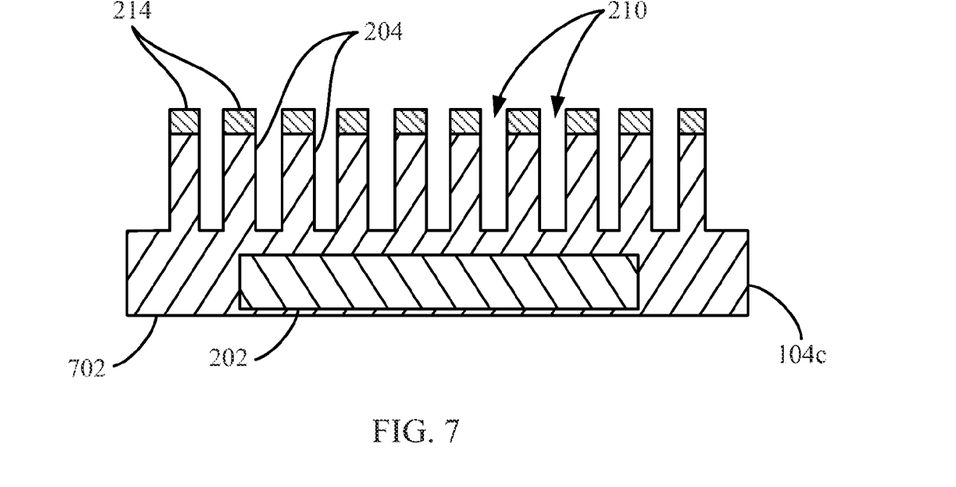
FIG. 7 illustrates a cross-sectioned elevation view taken at section A-A in FIG. 1 according to an example where a heat dissipation feature is integral to a component packaging.

Turning to FIG. 7, a cross sectioned elevation view is shown taken at section A-A in FIG. 1 according to at least one example where a heat dissipation feature 104c is integral with a package 702 of a heat-generating component 202. As illustrated, the heat dissipation feature 104c can be integrally incorporated with a package 702 for the heat-generating component 202. In such examples, the packaging 702 which includes the heat dissipation feature 104c can be exposed through an aperture of an enclosure (e.g., as illustrated in FIG. 2), or the packaging 702 can be formed integral to an enclosure (e.g., as illustrated in FIG. 3.

Referring to FIGS. 2, 3, and 7, various features will be described relating to one or more examples of heat dissipation features 104 of the present disclosure, where a heat dissipation feature 104 may comprise the structures of 104a, 104b and/or 104c, but are not so limited. The heat dissipation feature 104 is configured to facilitate conductive heat transfer from one or more heat-generating components 202 inside the enclosure 102 to the environment external to the enclosure 102, where such heat energy can be dissipated at least by convection to the external environment. The heat dissipation feature 104 may, in some examples, be configured as a heat sink.

As illustrated in FIGS. 2, 3, and 7, the heat dissipation feature 104 is thermally coupled with a heat-generating component 202. As used herein, the term "thermally coupled" refers to a coupling (e.g., mechanical or otherwise) that facilitates heat transfer from the heat-generating component 202 to the heat dissipation feature 104. A heat-generating component 202 may include any electronic and/or mechanical component within the enclosure 102 that generates heat. In at least some examples, the heat-generating component 202 may be one or more integrated circuits, such as a central processing unit (CPU) and/or a graphics processing unit (CPU). In other examples, the heat-generating component 202 may be one or more analog components such as power amplifiers, power converters, thermoelectric Peltier device, and/or photon emitting sources. Although the illustrated examples show the heat-generating component 202 with a smaller footprint than the heat dissipation feature 104, other examples may employ a heat-generating component with a footprint that is equal to or larger than a footprint of the heat dissipation feature 104.

Generally speaking, the heat dissipation feature 104 is sufficiently coupled to the heat-generating component 202 to facilitate conductive heat transfer from the heat-generating component 202. In some examples, the heat dissipation feature 104 is thermally coupled to the heat-generating component 202 by being positioned adjacent to the heat-generating component 202. In other examples, the heat-generating component 202 is thermally coupled to the heat dissipation feature 104 by being laterally offset from the heat dissipation feature 104 (not shown) and coupled via a thermally conductive strip, sheet, pipe, and/or some other suitable means. In still other examples, the heat dissipation feature 104 (e.g., heat dissipation feature 104c) is thermally coupled to the heat-generation component 202 by being formed integral to a component packaging. In further examples (not shown), the heat dissipation feature 104 is thermally coupled to the heat-generating component 202 by being positioned with one or more other thermal-conductive elements positioned between the heat dissipation feature 104 and the heat-generating component 202. In one such example, the heat generating component may comprise a flip chip including an active face (i.e. a first side) and a substrate (i.e. an opposing second side), where the substrate is coupled to the heat dissipation feature 104. The active face of such a flip chip may generate heat on its own and/or may experience heat due to its exposure to heat dissipated through a second integrated circuit coupled to the flip chip's active face. In this example, the flip chip (i.e. the heat generating component 202) may be thermally coupled to the heat dissipation feature 104 through the substrate, which substrate may include thermally conductive vias disposed therein. In all of the various examples, heat from the heat-generating component 202 is conductively transferred from the heat-generating component 202 to the heat dissipation feature 104. In any or all examples, other functional elements such as RF shielding, conformal coating and/or temperature sensors may be applied between or adjacent to the heat-generation component 202 and the heat dissipation feature 104.

As shown in FIGS. 2, 3, and 7, the heat dissipation feature 104 includes a plurality of protrusions 204 coupled to a base 208, and extending generally away from the heat-generating component 202. The protrusions 204 are exposed externally to the enclosure 102 to increase the surface area at the outer surface 106 of the enclosure 102. That is, the protrusions 204 are exposed to an environment external to the enclosure 102, and generally form at least a portion of the outer surface 106 of the enclosure 102. As shown in the example in FIG. 2, the heat dissipation feature 104 can be exposed through an aperture 206 formed in the enclosure 102. In other examples, such as the example shown in FIG. 3, the heat dissipation feature 104 can be formed integrally with the enclosure 102 and exposed to an external environment.

Each of the protrusions 204 may be formed by a plurality of fins (also identifiable by element 204) extending from the base 208 that is conductively coupled with the heat-generating component 202 to facilitate the conductive heat transfer from the heat-generating component 202. Each of the protrusions 204 is separated from the other protrusions 204 by a plurality of depressions 210 located between each of the plurality of protrusions.

Figure 4:
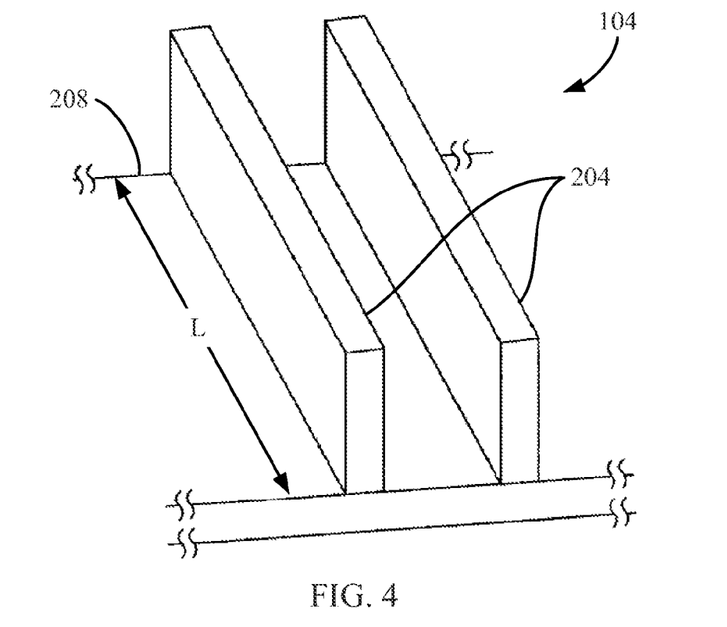
FIG. 4 is an enlarged isometric view of a heat dissipation feature according to at least one example including protrusions that extend across the length of the heat dissipation feature.
Figure 5:
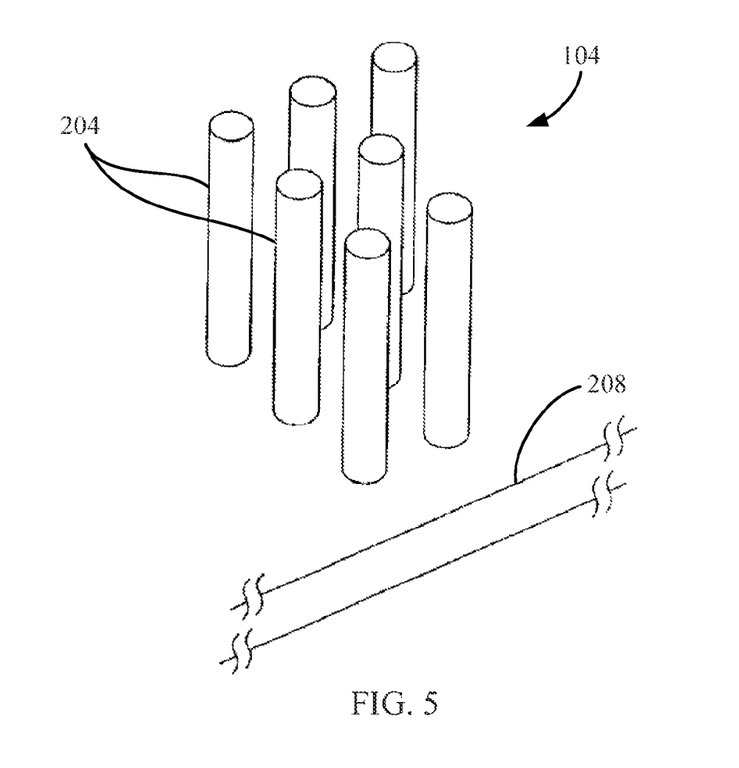
FIG. 5 is an enlarged isometric view of a heat dissipation feature according to at least one example including protrusions configured as posts.

The protrusions 204 may comprise any of a plurality of sizes and shapes. For instance, the protrusions 204 may be formed with a rectangular cross-section (as shown), a triangular cross-section, an ovate cross-section, or other cross-sectional shape, as well as combinations of different shapes. Similarly, the depressions 210 may be formed with any of a plurality of cross-sectional shapes, such as rectangular (as shown), triangular, ovate, or other shapes, as well as combinations of different shapes. According to at least some examples, the protrusions 204 can be formed to extend across the entire heat dissipation feature 104. For instance, FIG. 4 is an enlarged isometric view of a heat dissipation feature 104 showing protrusions 204 that extend across the length 'L' of the heat dissipation feature 104. In other examples, the protrusions 204 may be formed to only extend a portion of the width of the heat dissipation feature 104. For instance, FIG. 5 illustrates an enlarged isometric view of a heat dissipation feature 104 including protrusions 204 configured as posts (or pins). According to various examples, the protrusions 204 implemented as posts may be configured with any of a variety of shapes, including circular posts (as shown), square posts, rectangular posts, pyramid-shaped posts, elliptical posts, etc. as well as any combination of differently shaped posts.

Figure 9:
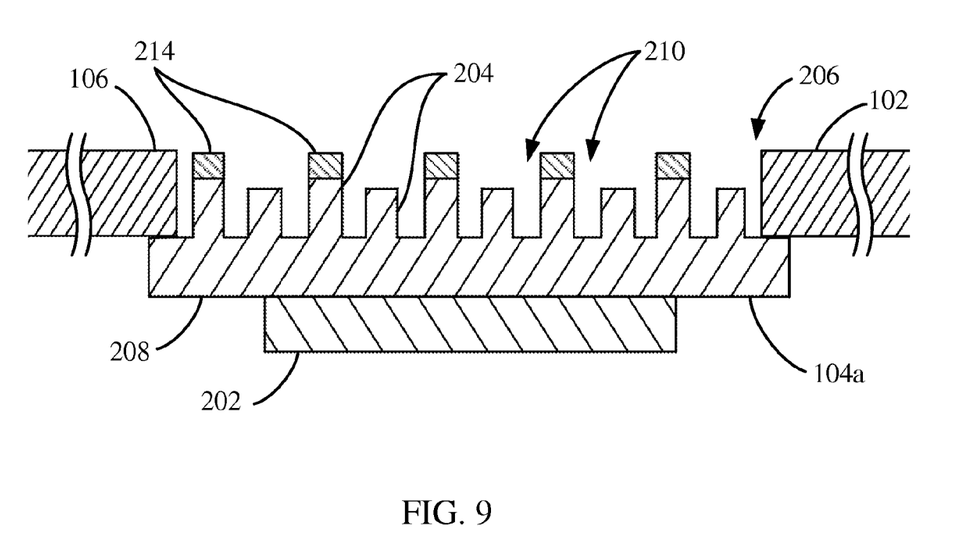
FIG. 9 illustrates a cross-sectioned elevation view taken at section A-A in FIG. 1 according to an example where a heat dissipation feature is exposed through an aperture in the enclosure and where the protrusions are configured to extend different lengths.

Referring again to FIGS. 2, 3, and 7, the protrusions 204 can be configured to extend about equal to the enclosure 102 in at least some examples. For instance, in various examples the protrusions 204 are sized and shaped to extend a distance equal to an outside surface of the enclosure 102. In other examples, the protrusions 204 can be configured to extend a distance less than the outside surface of the enclosure 102. For example, the protrusions 204 can be sized and shaped to be depressed below the outside surface of the enclosure 102, so that there is little or no contact with a user's skin. In still other examples, the protrusions 204 can be configured to protrude beyond the outside surface of the enclosure 102. In yet further examples, as depicted in FIG. 9, the protrusions 204 may be configured to extend different distances, so that some protrusions 204 extend a further distance than other protrusions 204. In other words, the heat dissipation feature 104 can be formed with at least some longer protrusions 204 and at least some shorter protrusions 204. According to at least one feature, the protrusions 204 can be generally sized and shaped such that the heat dissipation feature 104 does not significantly increase the size (e.g., the thickness) of the enclosure 102 and can be implemented with relatively small (e.g., thin) enclosures 102.

According to a feature, the heat dissipation feature 104 further includes a thermally insulating material 214 disposed on at least a tip portion of at least some of the plurality of protrusions 204. Generally speaking, the thermally insulating material 214 is a material selected to protect the user of the electronic device 100 from discomfort and/or injury (e.g., burns) that may be caused by the relatively high temperature of the heat dissipation feature 104 that is exposed to the environment external to the enclosure 102. Accordingly, the thermally insulating material 214 is positioned on at least the surface or surfaces that may come into contact with a user's skin, which surface is generally referred to herein as the tip portion of the protrusions 204. Accordingly, the thermally insulating material 214 can be disposed on at least a relatively small surface of the protrusions 204. The portion of a protrusion 204 including the tip portion may vary depending on the particular orientation (e.g., horizontal and/or vertical orientation) of the protrusions 204.

The portions of the protrusions 204 that do not have a thermally insulating material 214 disposed thereon may include areas that are small enough to protect the user from exposure to the relatively high temperature of the heat dissipation feature 104. Those areas of the protrusions 204 that are at least substantially free from the thermally insulating material 214 (e.g., side surfaces of the protrusions 204) can facilitate heat dissipation to the external environment.

In examples where the protrusions 204 are configured to extend different lengths (some longer protrusions 204 and some shorter protrusion 204), the thermally insulating material 214 may be disposed on at least the tip portions of those protrusions 204 extending a sufficient length to come into contact with a user's skin as depicted in FIG. 9. However, the protrusions 204 that extend a shorter length such that the shorter protrusions 204 will not come into contact with the user's skin may not have any thermally insulating material 214 disposed thereon as also depicted in FIG. 9. In some examples, the thermally insulating material 214 can also be disposed over one or more portions of an outside surface of the enclosure 102.

The thermally insulating material 214 employed in various examples of the present disclosure can be selected to provide a touch temperature that is equal to, or below some predetermined threshold. In at least some examples, the predetermined threshold may be about 45° C. In other examples, the predetermined threshold may be a temperature less than, or equal to about 60° C. This predetermined threshold can be associated with a predefined power dissipation value from one or more heat-generating components 202 of the electronic device 100 and/or for a given temperature at the outer surfaces 106 of the heat dissipation feature 104. For example, the thermally insulating material 214 can be selected to provide a touch temperature that is equal to, or below the predetermined threshold, when the temperature at the outer surfaces 106 of the heat dissipation feature 104 falls in a range from about 175° C. and below (e.g., between about 0° C. and about 175° C.).

The touch temperature refers to the actual temperature felt by the user's skin, as opposed to the measured temperature at the outer surfaces of the heat dissipation feature 104. Touch temperature (T(touch) or $T_{touch}$) can be described mathematically by the equation $$T(touch) = \frac{\sqrt{(k*\rho*Cp)\text{skin}} * T(\text{skin}) + \sqrt{(k*\rho*Cp)\text{insulation}} * T(\text{surface})}{\sqrt{(k*\rho*Cp)\text{skin}} + \sqrt{(k*\rho*Cp)\text{insulation}}}.$$

The portion of the equation expressed by $k*\rho*C_p$ represent values for thermal conductivity (k), density ($\rho$), and specific heat ($C_p$) being multiplied together.

The variable ($k*\rho*C_p$) skin refers to the value of $k*\rho*C_p$ for human skin. According to at least one example, human skin can be characterized as having a thermal conductivity (k) of about 0.2 W/(m*K), a density ($\rho$) of about 1,000 kg/m³, and a specific heat ($C_p$) of about 2,500 J/(kg*K). Accordingly, the product of $k*\rho*C_p$ for human skin is about 500,000 (J*W)/(m⁴*K²).

The variable T(skin) (or $T_{skin}$) refers to the temperature of human skin. This temperature can be characterized as about 36.6° C. for at least some examples.

The variable ($k*\rho*C_p$) insulation refers to the value of $k*\rho*C_p$ for the thermally insulating material 214.

The variable T(surface) (or $T_{surface}$) refers to the temperature at the outer surfaces 106 of the heat dissipation feature 104. This temperature is often a result of the junction temperature of the heat-generating component 202, as a result of the power dissipation of the heat-generating component 202. Accordingly, this temperature may be calculated and/or measured according to the various design constraints of the electronic device 100. According to the above equation, the touch temperature can result in a value that is lower than the measured temperature at the outer surfaces of the heat dissipation feature 104 ($T_{surface}$).

In some examples, attaining a touch temperature at or below the predetermined threshold may be accomplished by selecting a thermally insulating material 214 that has properties for thermal conductivity (k), density ($\rho$), and specific heat ($C_p$) which, when multiplied together ($k*\rho*C_p$), result in a value that is less than the same product for human skin. As noted above, the product of $k*\rho*C_p$ for human skin may be determined to be about 500,000 (J*W)/(m⁴*K²). The thermally insulating material 214 can therefore be selected to comprise a value for $k*\rho*C_p$ that is less than about 500,000 (J*W)/(m⁴*K²).

By way of example and not limitation, the thermally insulating material 214 may comprise a silicone rubber, polypropylene, high density polyethylene, polyurethane, and microcellular polymer foams. According to at least some examples, the thermally insulating material 214 may generally be of a light and insulative material.

Conventional electronic devices do not include a heat dissipation feature as described herein. Instead, the enclosure of most conventional electronic devices simply includes a relatively flat surface. As internal electronic components dissipate heat, the conventional enclosure typically heats up and the junction temperature for one or more internal electronic components may need to be controlled to avoid damage to the internal electronic component and/or to avoid discomfort or injury to the skin of the user. In such conventional electronic devices, the heat at the outer surface of the enclosure is primarily dissipated by convective heat transfer, and is therefore limited by the surface area of the enclosure. By employing a heat dissipation feature 104, the protrusions 204 increase the surface area at the outer surface 106 of the enclosure 102, resulting in improved heat dissipation.

For instance, in one example a conventional electronic device having an internal component operating at a particular power level such that the internal component is dissipating 3 watts (W) was found to have a junction temperature of 64.1° Celsius (C) and a temperature of 62.4° C. at the outer surface of the device enclosure, in the case of natural convection at the outer surface. By incorporating a heat dissipation feature 104 according to aspects of the present disclosure, a similarly configured internal component operating at the same power level where it is dissipating 3 watts was found to result in a junction temperature of just 44.3° C. and a temperature of 43.6° C. at the outer surfaces 106 of the heat dissipation feature 104 of the enclosure 102, in the case of natural convection. As shown by this example, the junction temperature is significantly decreased, enabling the heat-generating component 202 to dissipate greater amounts of power, and the temperature at the outer surface is also significantly decreased.

This improved heat dissipation enables heat-generating components 202 to operate more efficiently and at higher power levels, but does not necessarily protect the user's skin from discomfort and/or injury (e.g., burns). Accordingly, the selection of the thermally insulating material 214 can result in even farther protection to the user, and can enable a heat generating component to dissipate significantly greater amounts of power without causing discomfort and/or injury to the user's skin.

In at least one example, the thermally insulating material 211 is a fiber glass material having a value for $k*\rho*C_p$ of about 3,005 $(J*W)/(m^4*K^2)$. By incorporating this value into the touch temperature equation above, the touch temperature is equal to about $T_{skin}*0.928+T_{surface}*0.072$. As noted in the example set forth above for a heat-generating component 202 dissipating about 3 watts, the outer surfaces 106 of the heat dissipation feature 104 was measured at 43.6° C. Furthermore, the temperature for human skin can be estimated at about 36.6° C. Using these values in the present example, the resulting touch temperature is about 37.1° C. Therefore, although the measured temperature at the outer surfaces 106 of the heat dissipation feature 104 is 43.6° C., the temperature felt by the user's skin is only about 37.1° C. In addition, significant increases of the junction temperature, resulting in an increase to the temperature at the outer surfaces 106 will have only a small effect to the touch temperature. For instance, an increase in the temperature a the outer surfaces 106 to 100° C. will only increase the touch temperature to about 41.2° C. In examples where the predetermined threshold is 45° C., the touch temperature of about 41.2° C. is still within the predetermined threshold. Thus, an electronic device 100 can employ high performance internal components that use significant amounts of power and dissipate enough heat to increase the temperature at the outer surfaces 106 of the heat dissipation feature 104 to temperatures as high as 100° C. without exceeding the threshold value of 45° C.

It will be apparent to a person of ordinary skill in the art that selecting the thermally insulating material 214 to be a material just having a low value for thermal conductivity is not sufficient to significantly reduce the touch temperature. For instance, a cement plaster material may exhibit a relatively low thermal conductivity of just 0.7 W/(m*K), but the product of $k*\rho*C_p$ for cement plaster is about $1.456 \times 10^6$ $(J*W)/(m^4*K^2)$. Using this value in the equation for touch temperature for the previous example results in a touch temperature of about 41° C., which is a relatively small reduction from the 43.6° C. of the measured temperature at the outer surfaces 106. Furthermore, an increase in the temperature at the outer surfaces 106 to 100° C. results in an increase of the touch temperature to about 76.6° C., which may cause significant discomfort and/or injury to a user's skin.

According to another feature, by selecting the thermally insulating material 214 according to its values for the properties of thermal conductivity (k), density ($\rho$), and specific heat ($C_p$), the thermally insulating material 214 is further adapted to protect a user's skin against power surges. Such a power surge may cause an increase in the junction temperature and the temperature at the outer surfaces 106. However, the thermally insulating material 214 is adapted to facilitate a touch temperature that is increased only slightly by such a power surge.

Methods of making Electronic Devices with Heat Dissipation Features

Figure 6:
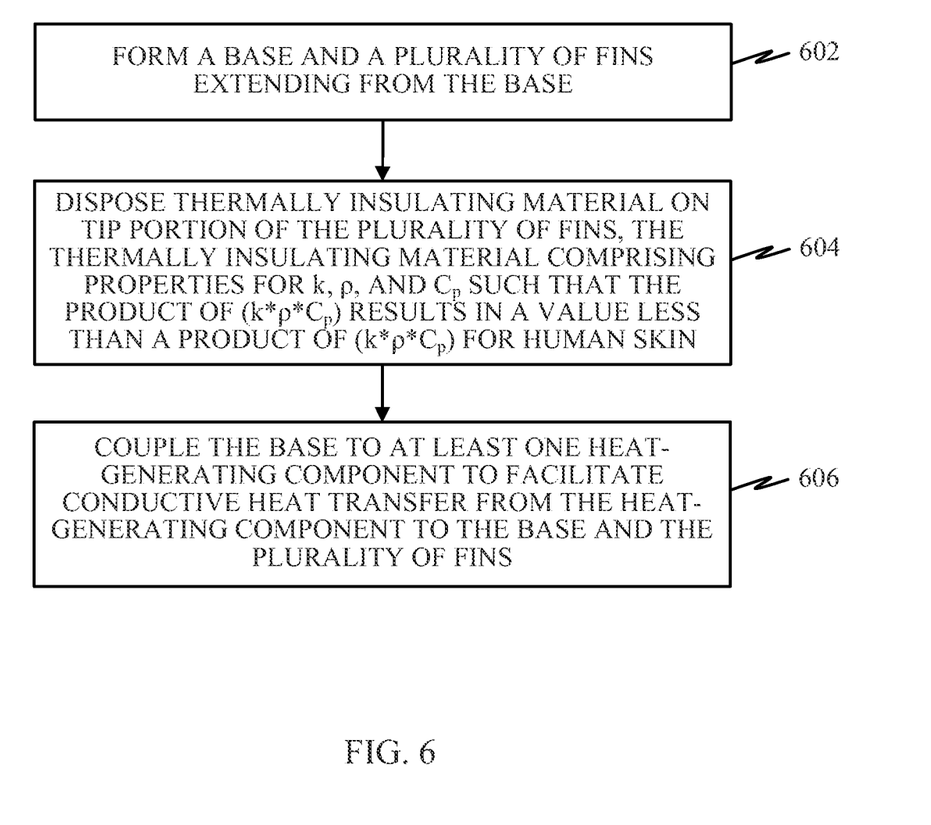
FIG. 6 is a flow diagram illustrating at least one example of a method of making an electronic device including a heat dissipation feature.

Various aspects of the present disclosure also relate to methods of making electronic devices with heat dissipation features. FIG. 6 is a flow diagram illustrating at least one example of a method of making an electronic device, such as the electronic device 100, including a heat dissipation feature. Referring to FIGS. 2, 3, 6, and 7, a base 208 is formed and a plurality of protrusions 204 are formed extending therefrom, at step 602. According to various implementations, the protrusions 204 can be formed to extend across the entire base 208 of a heat dissipation feature 104 (as illustrated in FIG. 4) and/or as a plurality of posts (as illustrated in FIG. 5).

The base 208 and the protrusions 204 can be formed as an integral unit, or the protrusions 201 can be formed separately, and subsequently coupled to the base 208. According to various implementations, the base 208 and protrusions 204 can be formed by extrusion, machining, casting, molding, or other manufacturing means, as well as combinations thereof.

The base 208 and the protrusions 204 can be formed from one or more materials adapted to facilitate the conduction of heat. For instance, the base 208 and the protrusions 204 may be formed of one or more materials having a relatively high value for thermal conductivity, such as a heat-conductive polymer, metal, metal alloy, composite, etc. In at least some non-limiting examples, the base 208 and the protrusions 204 may be formed of an aluminum alloy, copper, diamond (natural or synthetic), copper-tungsten pseudoalloy, silicon carbide in aluminum matrix (AlSiC), diamond in copper-silver alloy matrix (dymalloy), beryllium oxide in beryllium matrix (e-material), etc. In some examples, the base 208 and the protrusion 204 may be formed of different materials. For instance, the base 208 may be formed of a first material and the protrusion 204 may be formed of a second material.

In at least some implementations, the base 208, and in some instances the protrusions 204, can be formed as an integral part of an enclosure 102 and/or as an integral part of a package 702 for the heat-generating component 202. In some instances, the base 208 can be coupled to an aperture 206 of an enclosure 102. The protrusions 204 can be formed to extend a distance at least substantially equal to an outside surface of the enclosure 102 in some examples. In other examples, the protrusions 204 can be formed to be depressed below the outside surface of the enclosure 102. In still other examples, the protrusions 204 can be formed to protrude beyond the outside surface of the enclosure 102.

At step 604, a thermally insulating material 214 is disposed on at least the tip portion of the plurality of protrusions. As discussed above, the thermally insulating material 211 can be selected to provide a touch temperature that is below a predetermined threshold, according to the touch temperature equation discussed above. In at least some examples, the thermally insulating material 214 can be selected to include properties for thermal conductivity (k), density ($\rho$), and specific heat ($C_p$) such that a product of values for these three properties ($k*\rho*C_p$) results in a value less than a product of values for the same properties ($k*\rho*C_p$) for human skin. In other words, the thermally insulating material 214 can be selected so that the product ($k*\rho*C_p$) for the thermally insulating material 214 is lower than the product of ($k*\rho*C_p$) for human skin.

The thermally insulating material 214 may be disposed on at least the tip portion of the plurality of protrusions 204 in any of a plurality of different operations. By way of example and not limitation, the thermally insulating material 214 can be disposed on at least the tip portion of the protrusions 204 by extruding the thermally insulating material 214 together with the protrusions 204, by coupling the thermally insulating material 214 to at least the tips of the protrusions 204, by depositing the thermally insulating material 214 on at least the tips of the protrusions 204, etc. Some processes for disposing the thermally insulating material 214 on at least the tips of the protrusions 204 may include etching the thermally insulating material 214 away from areas (e.g., of the protrusions and/or of the enclosure) where the thermally insulating material 214 is not intended to remain.

At step 606, the base 208 is coupled to at least one heat-generating component 202 to facilitate conductive heat transfer from the heat-generating component 202 to the base 208 and the plurality of protrusions 204. As noted previously, the base 208 can be directly coupled to the heat-generating component 202, formed integral to a package 702 of the heat-generating component, and/or one or more other thermal-conductive elements may be disposed between the base 208 and the heat-generating component 202. In each instance, heat from the heat-generating component 202 is conductively transferred from the heat-generating component 202 to the base 208 and to the protrusions 204.

According to an aspect, the base 208 and protrusions 204, the thermally insulating material 214, and the at least one heat-generating component 202 can be integrated into one or more electronic devices.

It is noted that, although the forgoing method is depicted as a flow diagram showing the various steps as a sequential process, at least some of the forgoing acts can be performed in another sequence, in parallel, or substantially concurrently. In addition, the order of the acts may be re-arranged. For a firmware and/or software implementation of one or more steps in the forgoing method, the processes may be implemented with modules (e.g., procedures, functions, and so on) that perform the functions described herein. Any machine-readable medium tangibly embodying instructions may be used in implementing the processes described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

The various features of the examples described herein can be implemented in different constructions and arrangements without departing from the scope of the disclosure. It should be noted that the forgoing embodiments are merely examples and are not to be construed as limiting the disclosure. The description of the examples is intended to be illustrative, and not to limit the scope of the claims. As such, the present teachings can be readily applied to other types of apparatuses and many alternatives, modifications, and variations will be apparent to those skilled in the art.

What is claimed is:

1. An electronic device, comprising:
   an enclosure;
   at least one heat-generating component positioned within the enclosure;
   a heat dissipation component thermally coupled to the at least one heat-generating component to facilitate conductive heat transfer from the heat-generating component, the heat dissipation component comprising:
   a plurality of protrusions exposed externally to the enclosure; and
   a material disposed on at least a tip portion of at least some of the plurality of protrusions while other portions of the protrusions remain exposed, wherein the material is selected to comprise respective values for properties of thermal conductivity (k), density ($\rho$), and specific heat ($C_p$) such that a product of these values ($k*\rho*C_p$) is lower than a product of values for the same properties $k*\rho*C_p$ for human skin, wherein the material is selected to provide a touch temperature of 60° Celsius or less if a temperature at an outer surface of the heat dissipation component is 175° Celsius or less.

2. The electronic device of claim 1, wherein the heat dissipation component is integral with the enclosure.

3. The electronic device of claim 1, wherein the heat dissipation component is exposed through an aperture in the enclosure.

4. The electronic device of claim 1, wherein the heat dissipation component is integral with a package of the at least one heat-generating component.

5. The electronic device of claim 1, wherein at least some protrusions of the plurality of protrusions extend a distance equal to, or substantially equal to an outside surface of the enclosure.

6. The electronic device of claim 1, wherein at least some protrusions of the plurality of protrusions are depressed below an outside surface of the enclosure.

7. The electronic device of claim 1, wherein at least some protrusions of the plurality of protrusions protrude beyond an outside surface of the enclosure.

8. The electronic device of claim 1, wherein the plurality of protrusions include at least some longer protrusions that extend a further distance than ends of at least some shorter protrusions.

9. The electronic device of claim 8, wherein the longer protrusions are configured to extend a distance from the enclosure to be exposed to a user, and wherein the shorter protrusions are configured to extend a shorter distance from the enclosure to prevent contact by the user; and
   wherein the material is disposed on at least the tip portions of the longer protrusions and not on tip portions of the shorter protrusions.

10. The electronic device of claim 1, wherein the touch temperature is determined by the equation $$T(\text{touch}) = \frac{\sqrt{(k*\rho*Cp)\text{skin}} * T(\text{skin}) + \sqrt{(k*\rho*Cp)\text{insulation}} * T(\text{surface})}{\sqrt{(k*\rho*Cp)\text{skin}} + \sqrt{(k*\rho*Cp)\text{insulation}}}.$$

11. The electronic device of claim 1, wherein the product of $k*\rho*C_p$ for the insulating material is lower than 500,000 $(J*W)/(m^4*K^2)$.

12. The electronic device of claim 1, wherein the material provides a touch temperature that is equal to or below a predetermined threshold, wherein the predetermined threshold is a temperature value selected from the plurality of values in a range from 45° Celsius to 60° Celsius.

13. The electronic device of claim 1, wherein the tip portion of the at least some of the plurality of protrusions comprises at least one surface positioned to come into contact with a user.

14. The electronic device of claim 1, wherein the heat dissipation component is laterally offset from the at least one heat-generating component and is thermally coupled to the at least one heat-generating component via a thermally conductive strip.

15. The electronic device of claim 1, wherein the heat-generating component comprises a flip chip including:
   an active face that generates heat; and
   a substrate with at least one thermally conductive via, wherein the substrate is thermally coupled to the heat dissipation feature through the at least one thermally conductive via.

16. A heat dissipation feature comprising:
   a base adapted to facilitate conductive heat transfer from a heat-generating component;
   a plurality of protrusions extending from the base, wherein the plurality of protrusions are adapted for exposure external to an enclosure of an electronic device; and
   a material disposed on at least a tip portion of at least some protrusions of the plurality of protrusions while other portions of the protrusions remain exposed, wherein the material is selected to comprise respective values for properties of thermal conductivity (k), density ($\rho$), and specific heat ($C_p$) such that a product of these values ($k*\rho*C_p$) is less than a product of values for the same properties $k*\rho*C_p$ for human skin, wherein the material is selected to provide a touch temperature of 60° Celsius or less if a temperature at an outer surface of the plurality of protrusions is 175° Celsius or less.

17. The heat dissipation feature of claim 16, wherein the base is integral to the enclosure of the electronic device.

18. The heat dissipation feature of claim 16, wherein the base is integral to a package of the heat-generating component.

19. The heat dissipation feature of claim 16, wherein the plurality of protrusions are configured to extend across a width of the heat dissipation feature.

20. The heat dissipation feature of claim 16, wherein the plurality of protrusions are configured as a plurality of posts.

21. The heat dissipation feature of claim 16, wherein the material is further selected to provide a touch temperature that is below a predetermined threshold.

22. The heat dissipation feature of claim 16, wherein the product of $k*\rho*C_p$ for the insulating material is lower than 500,000 $(J*W)/(m^4*K^2)$.

23. The heat dissipation feature of claim 16, wherein the heat dissipation feature is incorporated into the electronic device.

24. The heat dissipation feature of claim 23, wherein the electronic device comprises at least one device selected from a group of devices comprising a mobile phone, a smart phone, a session initiation protocol (SIP) phone, a laptop, a notebook, a netbook, a smartbook, an ultrabook, a tablet, an e-book reader, a personal digital assistant (PDA), a global positioning system (GPS) device, a navigation device, a multimedia device, a video device, a music player, an entertainment unit, a set-top box, a fixed location data unit, a camera, and a game console.

25. The heat dissipation feature of claim 16, wherein the plurality of protrusions extending from the base comprise:
   a first plurality of protrusions that extend from the base, wherein the tip portions of the first plurality of protrusions include the material; and
   a second plurality of protrusions that extend a shorter distance from the base than the tip portions of the first plurality of protrusions, wherein the second plurality of protrusions do not include the material.

26. A method of making an electronic device, comprising:
   forming a base and a plurality of protrusions extending from the base;
   disposing a material on at least a tip portion of at least some protrusions of the plurality of protrusions while other portions of the protrusions remain exposed, wherein the material comprises respective values for properties of thermal conductivity (k), density ($\rho$), and specific heat ($C_p$) such that a product of these values ($k*\rho*C_p$) is less than a product of values for the same properties $k*\rho*C_p$ for human skin, wherein the material is selected to provide a touch temperature of 60° Celsius or less if a temperature at an outer surface of the plurality of protrusions is 175° Celsius or less; and
   disposing the base in relation to at least one heat-generating component to facilitate conductive heat transfer from the heat-generating component to the base and the plurality of protrusions.

27. The method of claim 26, wherein forming the base and the plurality of protrusions comprises:
   forming the base integral to an enclosure adapted to at least substantially enclose the heat-generating component.

28. The method of claim 26, further comprising:
   coupling the base to an enclosure adapted to at least substantially enclose the heat-generating component.

29. The method of claim 26, wherein forming the base and the plurality of protrusions comprises:
   forming the base integral with a package of the heat-generating component.

30. The method of claim 26, wherein disposing a material on the at least a tip portion of at least some protrusions of the plurality of protrusions, comprises:
   disposing the material further selected to provide a touch temperature that is below a predetermined threshold.

31. The method of claim 26, wherein disposing the material on the at least the tip portion of at least some protrusions of the plurality of protrusions, where the material comprises the respective values for the properties of the thermal conductivity (k), the density ($\rho$), and the specific heat ($C_p$) such that the product of these values ($k*\rho*C_p$) is less than the product of the values for the same properties $k*\rho*C_p$ for the human skin comprises:
   disposing the material on the at least the tip portion of at least some protrusions of the plurality of protrusions, where the material comprises respective values for properties of the thermal conductivity (k), the density ($\rho$), and the specific heat ($C_p$) such that the product of these values ($k*\rho*C_p$) is less than 500,000 $(J*W)/(m^4*K^2)$.

32. The method of claim 26, further comprising:
   incorporating the base and protrusions, the material, and the at least one heat-generating component into at least one device selected from a group of devices comprising a mobile phone, a smart phone, a session initiation protocol (SIP) phone, a laptop, a notebook, a netbook, a smartbook, an ultrabook, a tablet, an e-book reader, a personal digital assistant (PDA), a global positioning system (GPS) device, a navigation device, a multimedia device, a video device, a music player, an entertainment unit, a set-top box, a fixed location data unit, a camera, and a game console.

33. An electronic device, comprising:
   first means for conductively transferring heat from a heat-generating component within an enclosure of the electronic device to an environment external to the enclosure; and
   second means, disposed on at least a tip portion of the first means for conductively transferring heat while other portions of the means for conductively transferring heat remain exposed, for providing a touch temperature of 60° Celsius or less if a temperature at an outer surface of the first means for conductively transferring heat is 175° Celsius or less, wherein a material for the second means for providing the touch temperature is selected to comprise respective values for properties of thermal conductivity (k), density ($\rho$), and specific heat ($C_p$) such that a product of these values ($k*\rho*C_p$) is lower than a product of values for the same $k*\rho*C_p$ for human skin.

* * * * *